United States Patent
Alam et al.

(10) Patent No.: US 10,114,700 B2
(45) Date of Patent: Oct. 30, 2018

(54) MEMORY DEVICE WITH PAGE EMULATION MODE

(71) Applicant: Everspin Technologies, Inc., Chandler, AZ (US)

(72) Inventors: Syed M. Alam, Austin, TX (US); Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 212 days.

(21) Appl. No.: 15/347,307

(22) Filed: Nov. 9, 2016

(65) Prior Publication Data

US 2017/0060691 A1    Mar. 2, 2017

Related U.S. Application Data

(62) Division of application No. 14/155,816, filed on Jan. 15, 2014, now Pat. No. 9,529,726.

(60) Provisional application No. 61/846,169, filed on Jul. 15, 2013.

(51) Int. Cl.
| | |
|---|---|
| *G06F 12/00* | (2006.01) |
| *G06F 11/10* | (2006.01) |
| *G06F 12/0882* | (2016.01) |
| *G11C 14/00* | (2006.01) |

(52) U.S. Cl.
CPC ...... *G06F 11/1096* (2013.01); *G06F 11/1064* (2013.01); *G06F 12/0882* (2013.01); *G11C 14/0036* (2013.01); *G06F 2211/109* (2013.01); *G06F 2212/652* (2013.01)

(58) Field of Classification Search
None
See application file for complete search history.

(56) References Cited

U.S. PATENT DOCUMENTS

| | | |
|---|---|---|
| 8,171,255 B1 | 5/2012 | Koryakin et al. |
| 9,529,726 B2 | 12/2016 | Alam et al. |
| 2006/0200727 A1 | 9/2006 | Akiyama et al. |
| 2007/0136506 A1 | 6/2007 | Traut et al. |
| 2009/0177849 A1 | 7/2009 | Mazzola et al. |
| 2010/0332900 A1 | 12/2010 | Yang |
| 2012/0170399 A1 | 7/2012 | Ware et al. |
| 2012/0195112 A1 | 8/2012 | Alam et al. |
| 2012/0210043 A1 | 8/2012 | Joshi et al. |

FOREIGN PATENT DOCUMENTS

WO    WO-0052702 A1    9/2000

OTHER PUBLICATIONS

United States International Searching Authority, International Search Report and Written Opinion dated Jun. 11, 2014 for International Application No. PCT/US14/11634.

*Primary Examiner* — Daniel D Tsui
(74) *Attorney, Agent, or Firm* — Bookoff McAndrews, PLLC (57) ABSTRACT

In some examples, a memory is configured to write multiple pages of an internal page size from a cache on the memory to a memory array on the memory in response to receiving a single precharge command when in a page emulation mode. When in the page emulation mode, the memory also reads multiple pages of the internal page size from the memory array and stores them in the cache in response to receiving a single activate command.

20 Claims, 9 Drawing Sheets

MEMORY DEVICE WITH PAGE EMULATION MODE

RELATED APPLICATION

The present application is a divisional of U.S. patent application Ser. No. 14/155,816 filed Jan. 15, 2014. Both this application and application Ser. No. 14/155,816 claim priority to U.S. Provisional Application No. 61/846,169 to Alam et al., entitled "Page Emulation Mode in Spin-Torque MRAM and Method of Operation," filed Jul. 15, 2013. The contents of applications Ser. Nos. 14/155,816 and 61/846,169 are incorporated herein by reference in their entirety.

BACKGROUND

Memory devices, such as random access memories (RAM), typically receive commands from an external source, such as a memory device controller. Both the memory devices and the memory device controllers are configured to receive and issue the commands in a predetermined order when a controller is attempting to access data stored on the memory device. However, the memory device controllers are often designed with specific page size limitations.

Unfortunately, some types of memory devices are unable to accommodate the large page size associated with some of the memory device controllers. In order to accommodate these types of controllers, the memory device manufactures typically duplicate parts within the memory device itself, resulting in increased costs and size.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

This disclosure includes techniques and implementations to improve flexibility and compatibility of memory devices. In some implementations, memory devices are configured to store data in a memory array according to an internal page size and to load data into a cache for access by an external source according to an external page size. For example, the memory device may be configured with an internal page size that is smaller than the external page size associated with an external source, while still being able to accommodate memory accesses by the external source. In this manner, the memory device may be compatible with a wider range of external sources and/or memory device controllers.

In general, memory devices may be configured to receive a predetermined series of commands from the external source. For example, the memory device may be configured to receive an activate command that causes the memory device to perform an activate operation to open a page by loading the associated page from a memory array into a cache, one or more read and/or write commands to read and/or edit the contents of the page while the page is stored in the cache, and a precharge command to close the page by writing the contents of the cache back into the memory array.

In some implementations, the memory device includes a page emulation mode in order to accommodate external sources or memory device controllers that are configured with page sizes larger than those available to the memory device. Thus, when the emulation mode is active, the memory device may be configured to receive activate commands from an external source, such as a memory device controller, and to load a page of the external page size into the cache. The page of the external page size may be loaded into the cache by performing multiple sets of activate operations. For example, the memory device may have an internal page size of 512 bits and the external source may be configured to access pages of 1024 bits. In this example, the memory device may load two internal pages (each having a size of 512 bits) into the cache in response to a single activate command, such that the external source is able to access the two internal pages stored in the cache, as if the two 512 bit pages were a single 1024 bit page.

The memory device may also be configured to perform multiple precharge operations in response to receiving a single precharge command when the page emulation mode is active. For instance, if the memory device loads multiple pages of the internal page size into the cache following the activate command, the memory device may write each of the multiple pages back into the memory array following the precharge command. In some particular implementations, the memory device may determine which of the internal pages were written to by the external source and write only those pages back into the memory array.

In some particular implementations, the memory device may be configured to perform error correction or calculate parity bits related to the data stored in the cache. Typically, the error correction or the parity bit calculations is performed following a final read or write command to the page stored in the cache. However, when page emulation mode is enabled, the memory device may perform the error correction and/or parity bit calculations for each of the internal pages before writing the pages stored in the cache back to the memory array. In one example, the memory device may be configured to perform the error correction or parity bit calculations for the first internal page following the final read or write command, while performing the error correction or parity bit calculations for the additional internal pages when the precharge operations associated with the previous internal page are being carried out.

In some instances, the page emulation mode may be set at the time the memory device is installed in an electronic device, for instance, via the use of one or more fuse programmable registers. For example, if the memory device installed in the electronic device is configured with an internal page size of 512 bits and the controller installed in the electronic device is configured to read and write 1024 bit pages, the electronic device manufacturer or the memory device manufacturer may set a fuse programmable register to enable the page emulation mode. In other instances, the memory device may include a programmable register or an initialization register that may be used to enable or disable page emulation mode at various times, such as when the electronic device is powered up or when the activate command is issued from the external source. In one particular implementation, the memory device may include multiple programmable registers that may be enabled or disabled to indicate the size of the external page (e.g., a number of internal pages that correspond a single external page).

Figure 1:
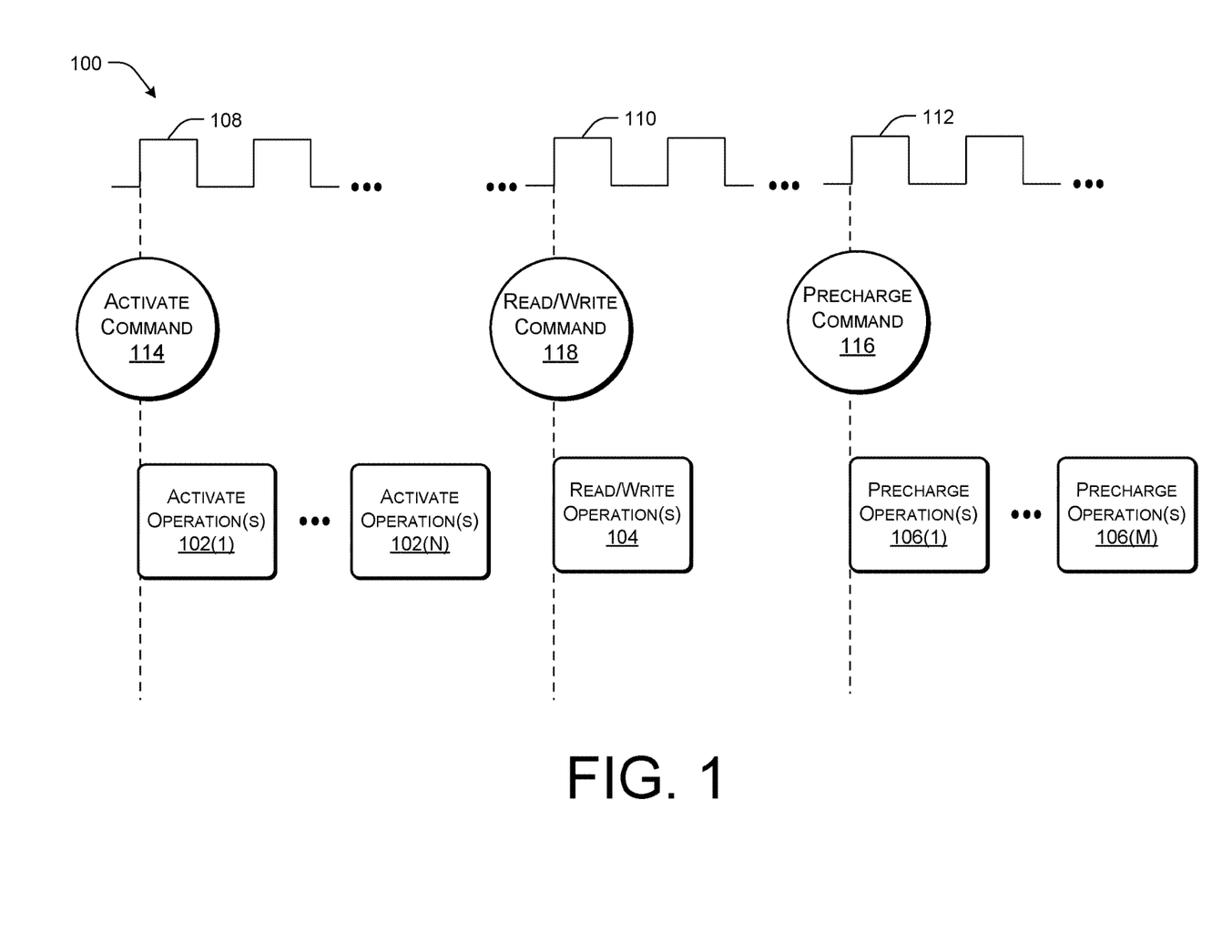
FIG. 1 illustrates an example timing diagram associated with a memory device according to some implementations.

FIG. 1 illustrates an example timing diagram 100 associated with a memory device according to some implementations. The timing diagram 100 illustrates events associated with an external source (e.g., a memory device controller) accessing a page of data of an external page size larger than an internal page size utilized by the memory device storing the data when the memory device is in page emulation mode. The timing diagram 100 is illustrated from the perspective of the memory device as the memory device receives commands from the external source and performs activate operations 102(1)-(N) to load one or more pages of data of the internal page size into a cache, one or more read and/or write operations 104 to read and/or edit the data stored in the cache, and precharge operations 106(1)-(M) to write the data in the cache back into a memory array.

The timing diagram 100 is illustrated based on clock signals and includes illustrated clock signals 108, 110, and 112. It should be understood that a length of time of each clock signal, a length of time between each of the clock signals, and a total number of clock signals, as well as the number of clock signals associated with each of the illustrated operations are implementation details and that additional clock cycles may exist between clock signals 108 and 110, between clock signals 110 and 112, and following clock signal 112.

In the illustrated example, the memory device is shown as performing multiple sets of activate operations 102(1)-(N) in response to receiving an activate command 114 and multiple sets of precharge operations 106(1)-(M) in response to receiving a precharge command 116. The number of activate operations 102(1)-(N) and precharge operations 106(1)-(M) performed by the memory device is based at least in part on a relationship of an external page size associated with the accessing source (e.g., the memory device controller) and the internal page size associated with a memory array of the memory device.

In an example, the memory device may be installed in an electronic device in conjunction with a memory device controller or external source that is configured with a minimum page size greater than the maximum internal page size of the memory device. Therefore, in some implementations, the memory devices described herein may be configured to utilize a page emulation mode to load a page that is larger than the maximum internal page size into a cache for access by the memory device controller. For instance, if the memory device controller is configured with a minimum page size of 1024 bits and the memory device is configured with a maximum page size of 512 bits, the memory device may be placed in a page emulation mode and perform two sets of activate operations 102(1)-(N) in response to the activate command 114 and two sets of precharge operations 106(1)-(M) in response to the precharge command 116 to imitate a memory device with page size of 1024 bits.

In this example, assume that the external source desires to read and/or write data to a particular page of the external page size (1024 bits). In order to do so, the external source issues the activate command 114 to the memory device to cause the memory device to load the particular page of the external page size (1024 bits) into the cache. Following receipt of the activate command 114, the memory device performs activate operation(s) 102(1) to load a first page of the internal page size or the first half of the data associated with the external page into the cache. Once the first internal page is stored in the cache, the memory device performs activate operation(s) 102(2) to load a second page of the internal page size or the second half of the data associated with the external page into the cache.

In some instances, the memory device places the second page adjacent to the first page in the cache bits, such that the external source may read and/or write the data in the cache bits as if the memory device loaded a single page of the external page size. For example, the external source may read and/or write data by issuing one or more read/write commands 118. In response to each of the read/write commands 118, the memory device performs a set of read/write operations 104 associated with the corresponding command. For example, the external source may issue a read command 118 followed by a write command 118 and the memory device may perform a first set of operations 104 associated with the read command and a second set of operations associated with the write command.

Once the external source is finished reading and/or writing the data stored in the cache, the external source may issue the precharge command 116 to the memory device. In response to receiving the precharge command 116, the memory device performs the precharge operations 106(1) to write the data associated with the first internal page or the first half of the data back into the memory array. Following the completion of the precharge operations 106(1), the memory device performs the precharge operations 106(2) to write the second internal page or the second half of the data back into the memory array.

In the present example, the number of activate operations 102(1)-(N) and the number of precharge operations 106(1)-(M) are the same. However, in other examples, the number of activate operations 102(1)-(N) performed may vary from the number of precharge operations performed. For example, if a write command 118 altered the contents of the first internal page but not the contents of the second internal page, the memory device may perform precharge operations 102(1) associated with writing the contents of the first internal page (e.g., the edited data) into the memory array without performing the precharge operations 102(2) associated with the second internal page (e.g., the unedited data).

As illustrated in the example of FIG. 1, each set of activate operations 102(1)-(N) are performed in sequence with no overlap. However, in some implementations, some of the operations associated with each set of activate operations 102(1)-(N) may be performed substantially in unison. For example, the operations associated with activate operations 102(1) carried out by a sense amplifier may be performed at the same time as the operations associated with the activate operations 102(N) carried out by a write driver.

In the manner described above, the memory device may be configured to utilize a page emulation mode to emulate page sizes larger than the maximum page size of the memory array internal to the memory device. In some implementations, the page emulation mode may be set at the time that the memory device is installed in an electronic device, for instance, via the use of one or more fuse programmable registers. In other implementations, the memory device may include programmable registers or initialization registers that may be used, for instance, by the external source to enable or disable page emulation mode. In one particular implementation, the memory device may include multiple programmable registers or bits that may be enabled or disabled to indicate the size of the external page (e.g., the number of internal pages equal to a single external page) and the number of activate operations 102(1)-(N) that are performed by the memory device in response to receiving the activate command 114.

Figure 2:
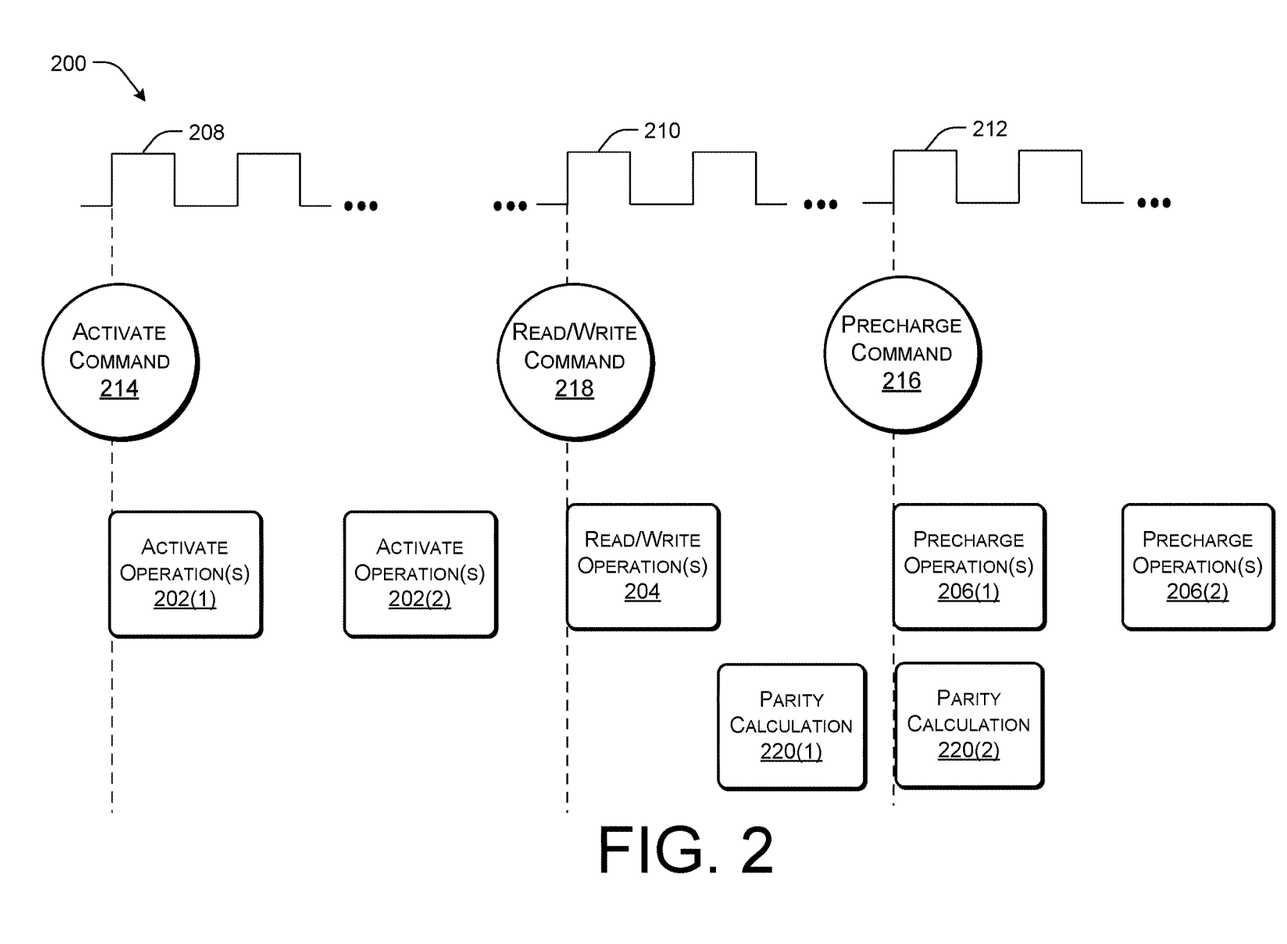
FIG. 2 illustrates a second example timing diagram associated with a memory device according to some implementations.

FIG. 2 illustrates a second example timing diagram 200 associated with a memory device according to some implementations. As with the timing diagram 100 of FIG. 1, the timing diagram 200 illustrates events associated with an external source (e.g., a memory device controller) accessing a page of data of an external page size larger than an internal page size utilized by the memory device storing the data. The timing diagram 200 is illustrated from the perspective of the memory device receiving commands from the external source. In the illustrated example, the memory device performs one or more sets of activate operations 202(1)-(2) to load two pages of data of the internal page size into a cache, one or more sets of read and/or write operations 204 to read and/or edit the data stored in the cache, and one or more sets of precharge operations 206(1)-(2) to write the data in the cache back into a memory array.

The timing diagram 200 is illustrated based on clock signals and includes illustrated clock signals 208, 210, and 212. It should be understood that a length of time associated with each of the clock signals, a length of time between each of the clock signals, and a total number of clock signals, as well as the number of clock signals to perform each of the illustrated operations are implementation details and that additional clock cycles may exist between clock signals 208 and 210, between clock signals 210 and 212, and following clock signal 212.

In the illustrated example, the page emulation mode causes the memory device to perform activate operations 202(1) and 202(2) in response to receiving an activate command 214 and precharge operations 206(1) and 206(2) in response to receiving a precharge command 216. Therefore, in the illustrated example, the external page size is twice the internal page size.

In the illustrated example, assume the external source desires to write data to a particular page of the external page size. In this example, the external source issues an activate command 214 to the memory device to cause the memory device to load the particular page into a cache. Following receipt of the activate command 214, the memory device performs activate operations 202(1) to load a first page of the internal page size or the first half of the data associated with the external page size into the cache and the activate operations 202(2) to load a second page of the internal page size or the second half of the data associated with the external page size into the cache.

When both the internal pages are loaded into the cache, the external source may read and/or write data as if the memory device loaded a single page of the external page size into the cache by issuing one or more read/write commands 218. As described above with respect to FIG. 1, in response to each of the read/write commands 218, the memory device performs read/write operations 204 associated with the corresponding command. For the purposes of the present example, assume that the external device issued a write command 218 that caused some of the data associated with the first internal page and some of the data associated with the second internal page in the cache to be edited and that the memory device is configured to perform error correction or parity bit calculations.

In this example, the memory device may be configured to perform the parity calculations 220(1) associated with the first internal page following the final read/write command 218 (i.e., in the time period before receiving the precharge command 216 or in the time before clock signal 212). The memory device may further be configured to perform the precharge operations 206(1) associated with the first internal page, whose parity bits were previously calculated during the time period assigned to the read/write operations 204, and the parity calculations 220(2) associated with the second internal page in parallel (i.e., in the time period following receiving the precharge command 216). Following the completion of both the precharge operations 206(1) and the parity calculations 220(2), the memory device performs the precharge operations 206(2) and fully writes the data associated with the external page back to the memory array.

In this manner, memory devices are able to implement page emulation without the additional time associated with performing error correction or parity bit calculations. Additionally, while the illustrated example is described with respect to a memory device implementing page emulation in which a size of two internal pages equals a size of a single external page, it should be understood that if the memory device is configured to apply page emulations with K internal pages, the memory device may continue to perform precharge operations for the (K−1)th internal page and parity calculations for the (Kth) internal page in parallel until the parity calculations associated with the Kth internal page are completed.

Figure 3:
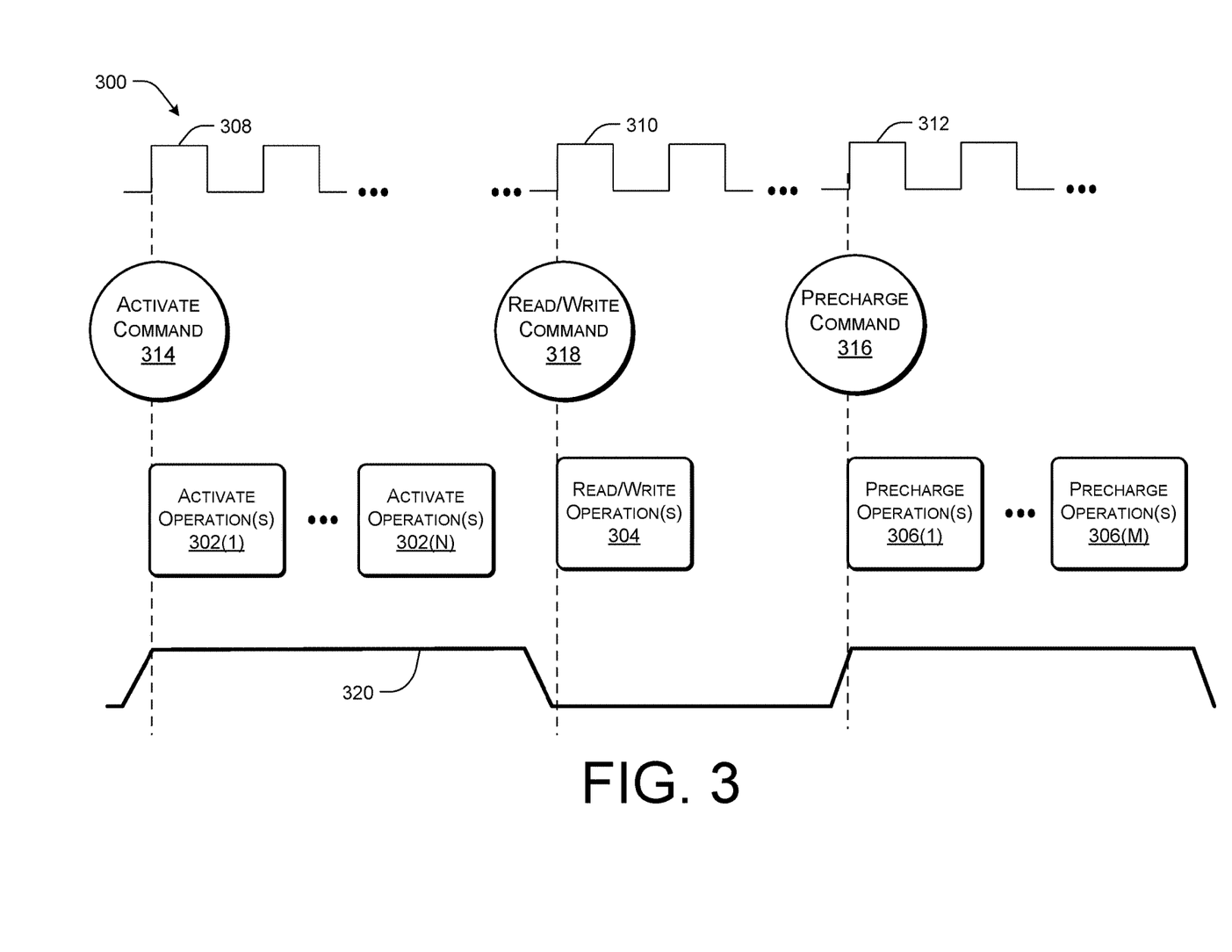
FIG. 3 illustrates another example timing diagram associated with a memory device according to some implementations.

FIG. 3 illustrates another example timing diagram 300 associated with a memory device according to some implementations. As with the timing diagrams 100 and 200 of FIGS. 1 and 2, the timing diagram 300 illustrates events associated with an external source (e.g., a memory device controller) accessing a page of data of an external page size larger than an internal page size utilized by the memory device storing the data when the memory device is in page emulation mode. The timing diagram 300 is illustrated from the perspective of the memory device as the memory device receives commands from the external source and performs one or more sets of activate operations 302(1)-(N) to load one or more pages of data of the internal page size into a cache, one or more read and/or write operations 304 to read or edit the data stored in the cache, and one or more sets of precharge operations 306(1)-(M) to write the data in the cache back into a memory array.

The timing diagram 300 is illustrated based on clock signals and includes illustrated clock signals 308, 310, and 312. It should be understood that a length of time of each of clock signals, a length of time between each of the clock signals, and a total number of clock signals, as well as the number of clock signals to perform each of the illustrated operations are implementation details and that additional clock cycles may exist between clock signals 308 and 310, between clock signals 310 and 312, and following clock signal 312.

In the illustrated example, the page emulation mode causes the memory device to perform multiple sets of activate operations 302(1)-(N) in response to receiving an activate command 314 and multiple precharge operations 306(1)-(M) in response to receiving a precharge command 316. The number of activate operations 302(1)-(N) and precharge operations 306(1)-(M) performed when the memory device is in the page emulation mode in response to receiving the corresponding command is based at least in part on a relationship of an external page size associated with the accessing source (e.g., the memory device controller) and the internal page size associated with a memory array of the memory device.

In the illustrated example, assume that the external source desires to read and/or write data to a particular page of the external page size (1024 bits). In this example, the external source issues the activate command 314 to the memory device to cause the memory device to load the particular page into a cache of at least the external page size (1024 bits). Following receipt of the activate command 314, the memory device performs activate operations 302(1) to load a first page of the internal page size or the first half of the data associated with the external page into the cache. Once the first internal page is stored in the cache, the memory device performs activate operations 302(2) to load a second page of the internal page size or the second half of the data associated with the external page into the cache.

When both the internal pages are loaded into the cache, the external source may read data from the cache and/or write data into the cache as if the memory device had loaded a single page of the external page size into the cache by issuing one or more read/write commands 318. In response to each of the read/write commands 318, the memory device performs read/write operations 304 associated with the corresponding command. For example, the external source may issue a read command 318 followed by a write command 318. In response, the memory device may perform a first set of operations associated with the read command and a second set of operations associated with the write command.

Once the external source is finished reading and/or writing the data stored in the cache, the external source issues the precharge command 316 to the memory device. In response to receiving the precharge command 316, the memory device performs the precharge operations 306(1) to write the data associated with the first internal page or the first half of the data back into the memory array. Following the completion of the precharge operations 306(1), the memory device performs the precharge operations 306(2) to write the second internal page or the second half of the data back into the memory array.

In the present example, the number of activate operations 302(1)-(N) and the number of precharge operations 306(1)-(M) are the same. However, in other examples, the number of activate operations 302(1)-(N) performed may vary from the number of precharge operations preformed. For example, if a write command 318 altered the contents of the first internal page but not the contents of the second internal page, the memory device may perform precharge operations 306(1) associated with writing the contents of the first internal page (e.g., the edited data) back into the memory array without performing the precharge operations 306(2) associated with the second internal page (e.g., the unedited data).

In some implementations, in order to reduce the overhead associated with performing more than one activate operation and more than one precharge operation, the memory device may be configured to store each internal page associated with a single external page in the same physical row of the memory array but in different physical columns. By storing the internal pages associated with the same external page in the same physical row of the memory array, a word line voltage 320 may remain high while the activate operations 302(1)-(N) associated with loading each internal page into the cache is preformed. Likewise, the word line voltage 320 may again remain high while each precharge operation associated with writing each internal page back to the memory array are performed, as illustrated in FIG. 3.

By keeping the word line voltage 320 high during the entire period associated with performing the activate operations 302(1)-(N) and again during the entire period associated with performing the precharge operations 306(1)-(M), the memory device may save power consumed by the word line circuitry (e.g., the charge pumps) as the word line voltage 320 is alternated. More details with respect to the physical layout of a memory device configured with page emulation mode is described below with respect to FIG. 4.

Figure 4:
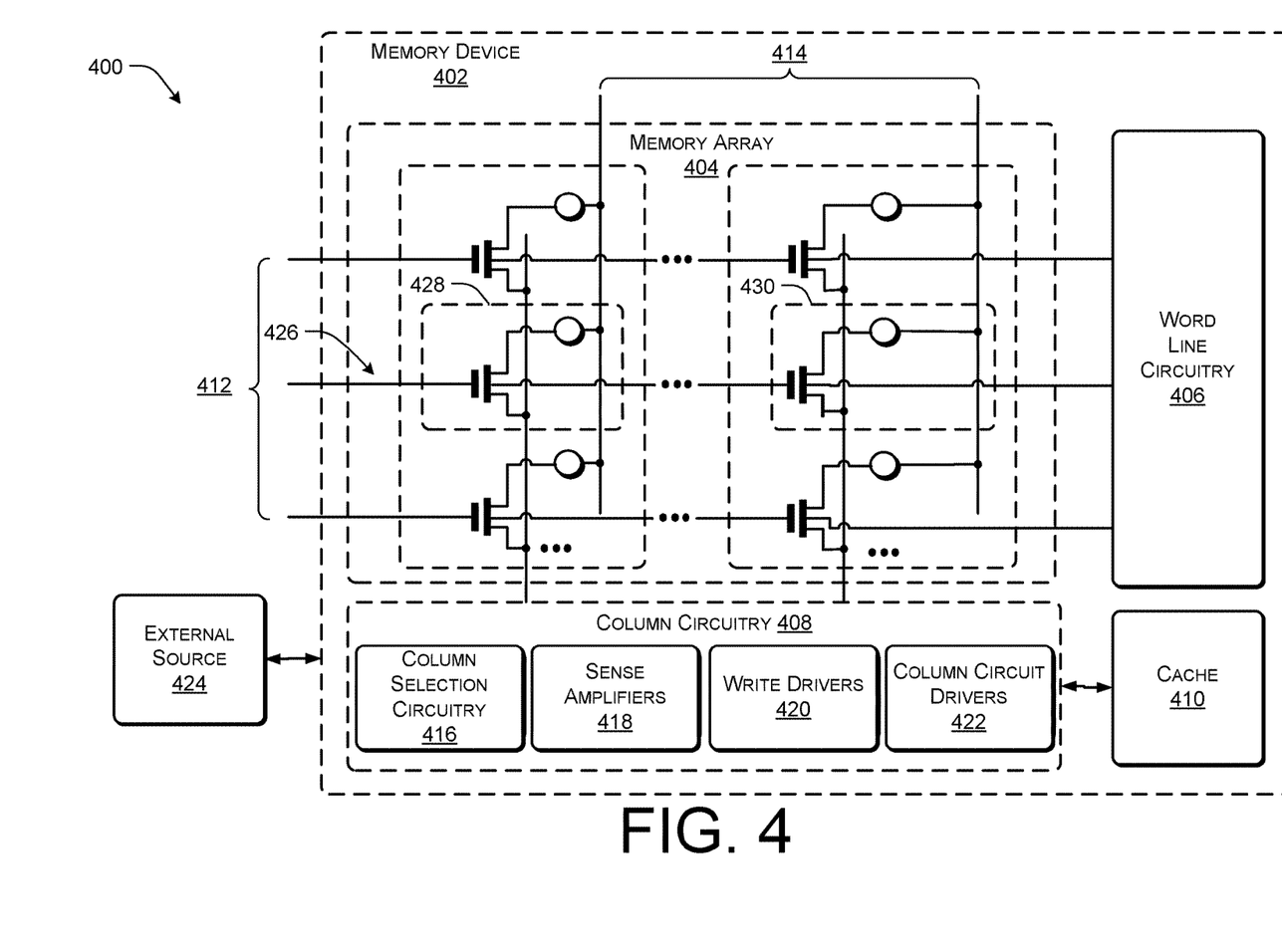
FIG. 4 illustrates a device framework including select components of an example memory device according to some implementations.

FIG. 4 illustrates a device framework 400 including select components of an example memory device 402 according to some implementations. In general, the memory device 402 includes a memory array 404, word line circuitry 406, column circuitry 408, and is connected to at least one cache 410 accessible by one or more external sources. The memory device 402 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that can be used to store information. In one particular example, the memory device may be a magnetic memory or magnetic disk storage, such as an MRAM device.

The memory array 404 is arranged in a grid including physical rows, generally indicated by 412, and physical columns, generally indicated by 414. While the memory array 404 is illustrated with three physical rows 412 and two physical columns 414, the memory array 404 may contain any number of physical rows and columns depending on the size of the array. In some implementations, the memory array 404 may include multiple memory banks each arranged to include an array with physical rows and columns and, in some cases, the memory device 402 may be configured such that multiple memory banks may be accessed in parallel.

The word line circuitry 406 is communicatively coupled with the physical rows 412 of the memory array 404 and includes circuitry, such as level shifter drivers, for driving a word line voltage across the physical row 412 when the physical rows 412 are being accessed by the memory device 402. The column circuitry 408 is configured to read and/or write data to the physical columns 414 in the memory array 404. The column circuitry 408, as illustrated, includes some non-limiting example components, such as column selection circuitry 416, sense amplifiers 418, write drivers 420, and/or column circuit drivers 422. The column circuitry 408 is also connected to one or more caches 410 and configured to load data from the memory array 404 into the cache 410 to write data from the cache 410 back into the memory array 404.

The memory device 402 is configured to operate in a page emulation mode. As described above, the page emulation mode causes the memory device 402 to load multiple pages of an internal page size from memory array 404 into the cache 410 in response to receiving an activate command and to write the multiple pages from the cache 410 back into the memory array 404 in response to receiving a precharge command. In order to save power and reduce access time associated with reading and writing multiple pages, in some implementations, the memory array 404 is configured to store adjacent pages in the same physical row 412. By storing adjacent pages in the same physical row 412, the word line circuitry 406 is able to drive a single word line voltage high while the activate operations associated with loading each internal page into the cache 410 and the precharge operations associated with writing each internal page back into the memory array 404 are performed.

In the implementations in which adjacent pages are stored in the same physical row 412, physical column addresses associated with each physical row 412 may be assigned to store data associated with different pages. For example, every Kth physical column address in a physical row 412 may be assigned to store values associated with a single internal page. Thus in this example, each physical row 412 may store up to K pages that may be selected and multiplexed by the column circuitry 408 when accessed. The number of internal pages stored in each physical row 412 may vary depending on the internal page size and the size of each physical row 412.

In an example, the memory device 402 receives an activate command from an external source 424 to load a page of the external page size from memory array 404 into the cache 410. In response, the word line circuitry 406 drives a word line voltage across one of the physical rows 412, for instance in the illustrated example physical row 426, to allow the memory device 402 to perform activate operations associated with loading multiple internal pages associated with the external page into the cache 410.

While the word line voltage of physical row 426 is high, the column circuitry 408 performs the activate operations associated with loading the first internal page including accessing, multiplexing, and loading data from physical column addresses, illustrated as column address 428, in the physical row 426 associated with a first internal page into the cache 410. Once the activate operations associated with the first internal page are complete, the column circuitry 408 performs the activate operations associated with loading the second internal page including accessing, multiplexing, and loading data from physical column addresses, illustrated as column address 430, in the physical row 426 associated with a second internal page into the cache 410 adjacent to the data associated with the first internal page.

FIGS. 5-9 are flow diagrams illustrating example processes of memory devices implementing page emulation modes. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Figure 5:
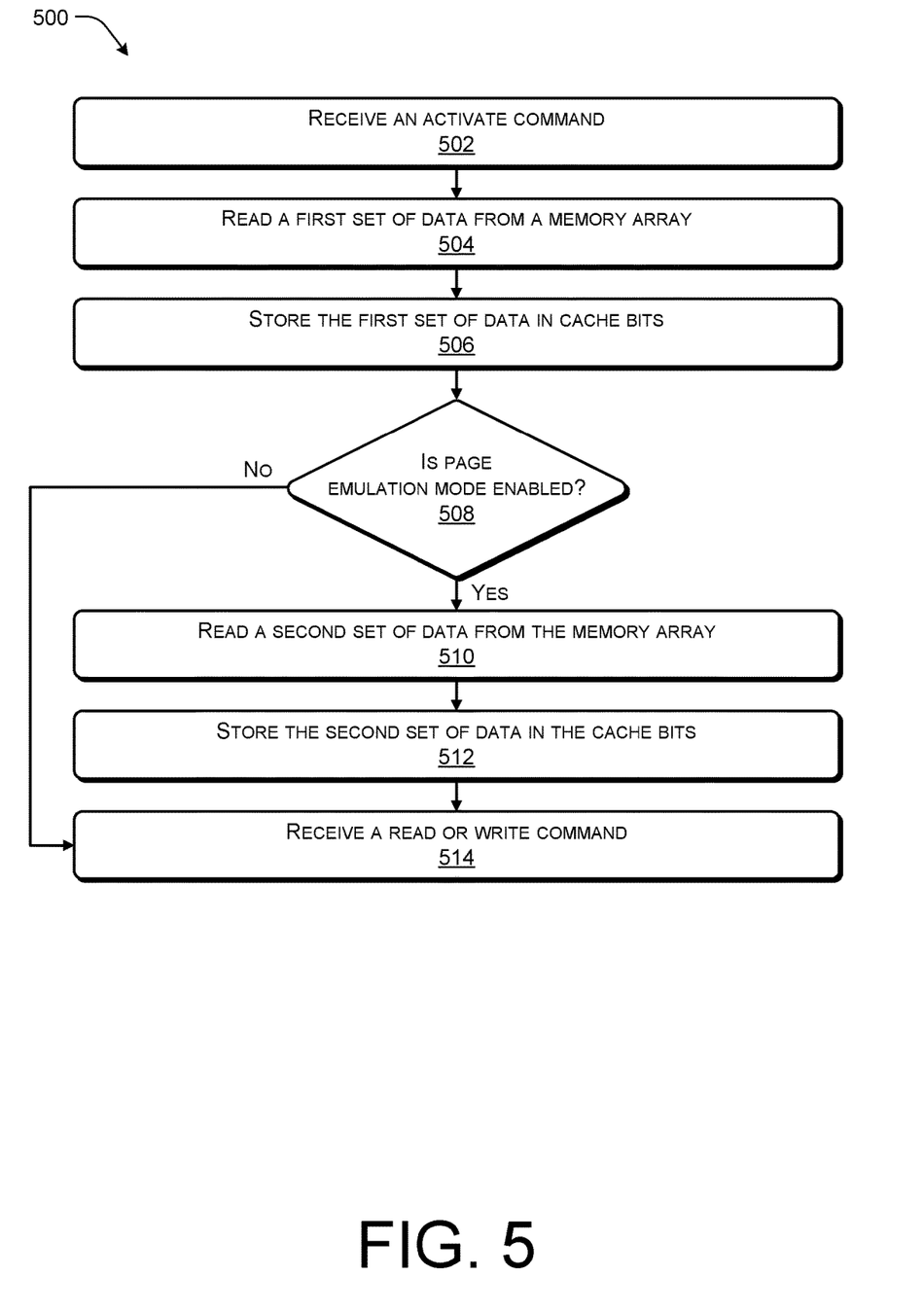
FIG. 5 illustrates an example flow diagram showing an illustrative process for responding to an activate command according to some implementations.

FIG. 5 illustrates an example flow diagram showing an illustrative process 500 for responding to an activate command according to some implementations. In general, the process 500 may be implemented by a memory device configured with a page emulation mode. The page emulation mode may be configured at the time of manufacture or installation of the memory device into a larger assembly, for example, through the use of a fuse programmable register. Alternatively, the page emulation mode may be set as part of an initialization or power-on sequence and/or as part of the activate command itself, for example, through the use of a programmable register. As described above, when enabled, the page emulation mode causes the memory device to load multiple pages of a page size internal to the memory device into a cache for access by an external source in response to a single activate command.

At 502, the memory device receives an activate command from an external source, such as a memory device controller. The activate command is a command to load data associated with a page of external page size (e.g., the page size associated with the external source issuing the activate command) into a cache, such that the external source may read and write data to the page.

At 504, the memory device reads a first set of data from a memory array. The first set of data is equal to a page of the internal page size and associated with at least a first portion of the data requested in the activate command. For example, if the internal and external page sizes are equal, the first set of data may be the entire set of data requested by the external source in the activate command. However, if the internal page size is less than the external page size, the first set of data is only a first portion of data requested in the activate command.

At 506, the memory device stores the first set of data in cache bits. In general, the cache bits are accessible by the external source. The size of the cache is at least equal to the size of the external page but in some cases may be larger than the size of the external page. For example, if the page emulation mode of the memory device is configurable to operate with various external page sizes, the memory device may be connected to a cache with a cache size that is large enough to accommodate the largest expected external page size.

At 508, the memory device determines if a page emulation mode is enabled. For example, the memory device may check one or more programmable registers to determine if the page emulation mode is active and, in some implementations, to determine the size of the external page (e.g., the size of the page that the external source is expecting to find in the cache bits following the completion of the activate operations). If the page emulation mode is disabled, the process 500 proceeds to 514. Otherwise, the process 500 advances to 510.

At 510, the memory device reads a second set of data from the memory array, as the page emulation mode is enabled and the first set of data is only a portion of the data associated with the external page requested in the activate command. The second set of data may be stored in the memory array as the internal page following the first set of data previously loaded into the cache bits. As described above, in some implementations, the first set of data and the second set of data may be stored as two pages in the same physical row of the memory array, as shown in FIG. 4.

At 512, the memory device stores the second set of data in cache bits. The memory device stores the second set of data in the cache bits adjacent to or following the cache bits associated with the first set of data, such that the cache bits associated with the first set of data and the cache bits associated with the second set of data appear as a single page of the external page size to the external source. In other implementations, the first set of data and the second set of data can be stored in the cache bits in any order or arrangement. In the illustrated process 500, the external page size is equal to two internal pages, however, if the external page size was equal to three internal pages, the memory device may load a third set of data associated with a third internal page into the cache bits adjacent to or following the cache bits storing the second set of data. Further, it will be appreciated that the memory device may load additional sets of data associated with additional internal pages depending on the external page size.

At 514, the memory device receives a read or write command from the external source. The read and/or write commands are related to accessing the data stored in the cache bits. The read and write commands are configured to access cache bits by addressing a portion of the cache bits based an external page size.

Figure 6:
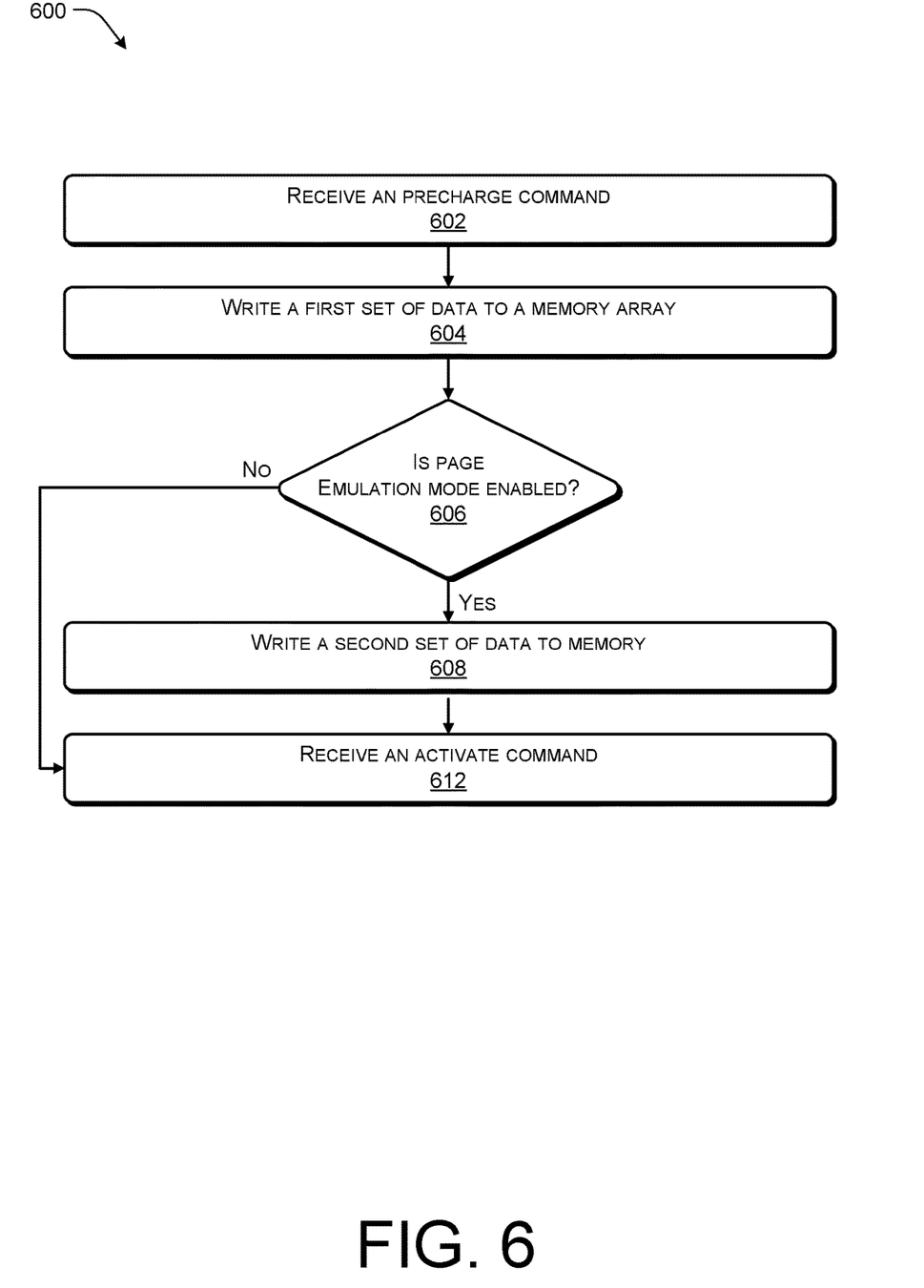
FIG. 6 illustrates an example flow diagram showing an illustrative process for responding to a precharge command according to some implementations.

FIG. 6 illustrates an example flow diagram showing an illustrative process 600 for responding to a precharge command according to some implementations. In general, the process 600 may be implemented by a memory device configured to include a page emulation mode. At 602, the memory device receives a precharge command from an external source, such as a memory device controller. The precharge command is a command to write data associated with a page of external page size (e.g., the page size associated with the external source issuing the precharge command) from a cache back into a memory array from which the page was originally obtained.

At 604, the memory device writes a first set of data from a cache into a memory array. The first set of data is equal to a page of the internal page size and associated with at least a first portion of the data stored in the cache. For example, if the internal and external page sizes are equal, the first set of data may be the entire set of data stored in the cache. However, if the internal page size is less than the external page size, the first set of data may only be the first portion of data stored in the cache.

At 606, the memory device determines if a page emulation mode is enabled. For example, the memory device may check one or more programmable registers to determine if the page emulation mode is active and, in some implementations, to determine the external page size (e.g., the size of the page stored in the cache). If the page emulation mode is disabled, the process 600 proceeds to 612. Otherwise, the process 600 advances to 608.

At 608, the memory device writes a second set of data from a cache into a memory array, as the page emulation mode is enabled and the first set of data is only a portion of the data stored in the cache. The second set of data is data stored in the memory array as the internal page following the first set of data previously loaded into the array. At 612, the memory device receives an activate command from the external source to load another page of the external page size into the cache.

The processes 500 and 600 of FIGS. 5 and 6 are described and illustrated with respect to a single external source issuing commands. However, in some implementations, the memory device may be configured to receive commands from multiple external sources each having a different external page size. For example, the memory device may receive an activate or precharge command from a first external source with a page size of 2048 bits and a second activate command from a second external source with a page size of 1024 bits. In this example, the first external source may enable the page emulation mode with an external page size of 2048 bits, for example, by setting or causing one or more programmable registers associated with the memory device to be set as part of the activate and/or precharge command. For instance, if the internal page size is 512 bits, the external source may set four registers to indicate the external page size is equal to four internal pages (i.e., four pages of 512 bits corresponds to an external page size of 2048 bits). The second external source, as part of the activate command, may update the page emulation mode to respond to an external page size of 1024 bits, for example, by unsetting two of the four registers (i.e., unsetting two pages of 512 bits to accommodate an external page size of 1024 bits rather than 2048 bits).

Figure 7:
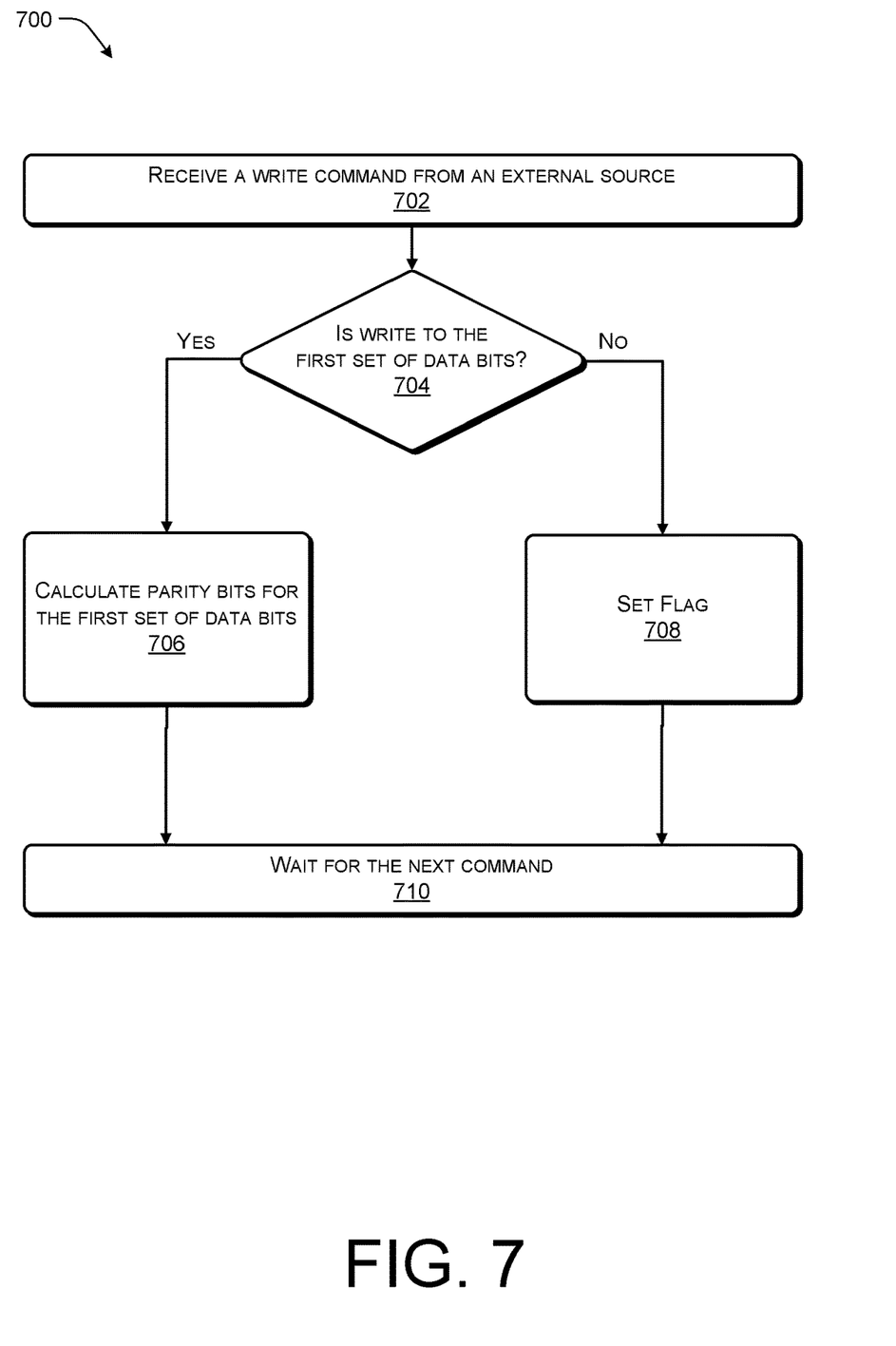
FIG. 7 illustrates an example flow diagram showing an illustrative process for responding to a write command according to some implementations.

FIG. 7 illustrates an example flow diagram showing an illustrative process 700 for responding to a write command according to some implementations. In general, the process 700 may be implemented by a memory device configured to include a page emulation mode in which the external page size is equal to twice the size of the internal page size, such that two pages of internal size are loaded into the cache before receiving a read or write command from the external source. At 702, the memory device receives a write command from an external source, such as a memory device controller. The write command is a command to edit a portion of data associated with a page of external page size (e.g., the page size associated with the external source) stored in a cache.

At 704, the memory device determines if the write command is directed to a first set of data bits (e.g., the data associated with the first internal page) and if the write command is directed to the first set of data bits, the process 700 proceeds to 706. At 706, the memory device calculates the parity bits for the first set of data bits.

If, however, the write is not directed to the first set of data bits, the process 700 advances to 708, as the write is directed to the second set of data bits (e.g., the data associated with the second internal page stored in the cache). At 708, the memory device sets a flag. The flag is an indication that the second set of data is dirty and that before the memory device writes the second set of data back to the memory array during the precharge phase, it may be appropriate for the memory device to calculate the parity bits for the second set of data bits.

After setting the flag or calculating the parity bits for the first set of data bits, the process 700 advances to 710. At 710, the memory device waits for the next command from the external source. The next command may be a precharge command to write back the data of the cache to the memory array and prepare the cache for another page, a read command to read the data stored in the cache, and/or another write command.

Figure 8:
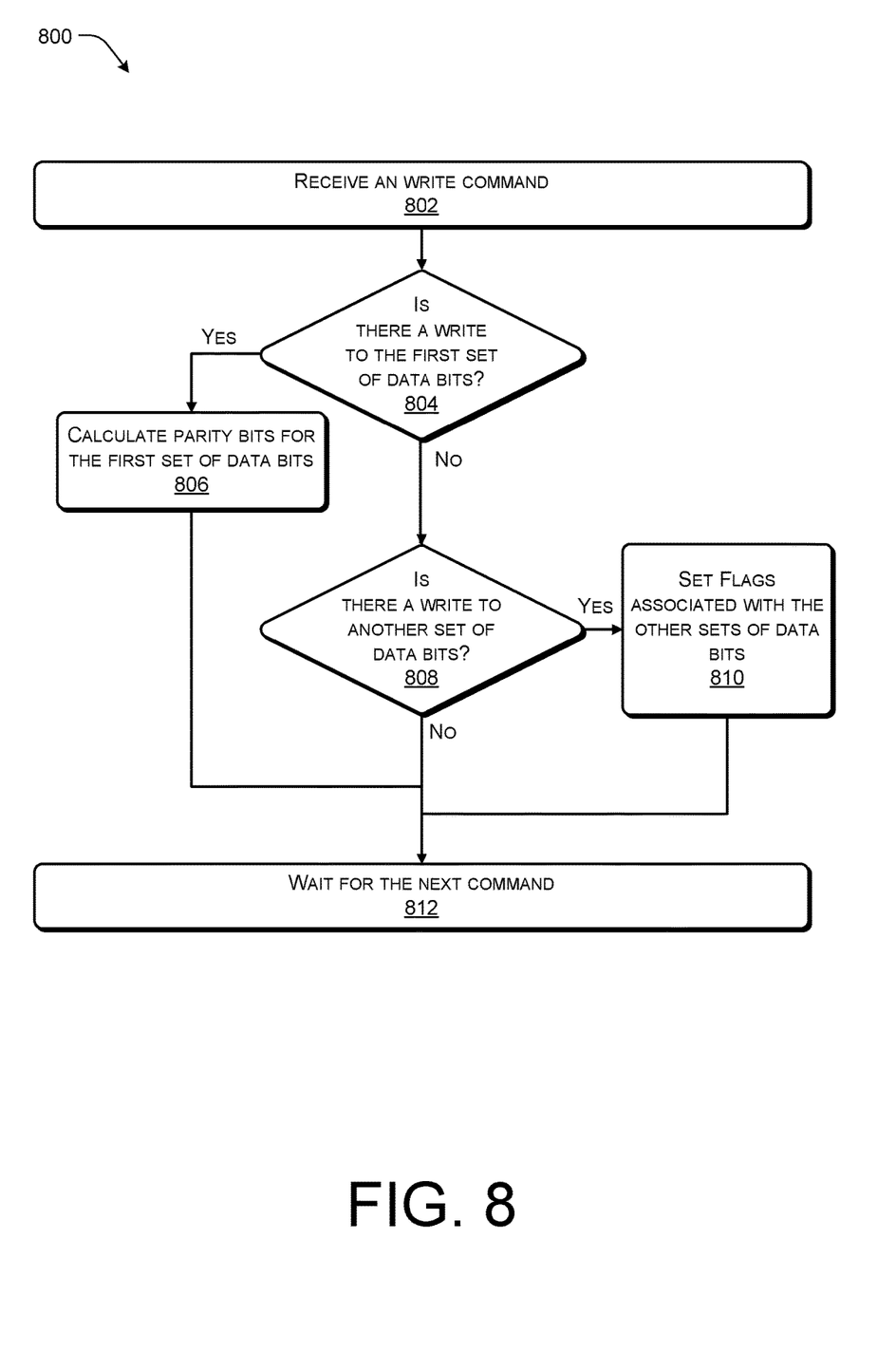
FIG. 8 illustrates an example flow diagram showing an illustrative process for responding to a write command according to some implementations.

FIG. 7 is an example flow diagram showing an illustrative process 700 associated with a memory device implementing page emulation mode where two internal pages equal a single external page. However, in some cases, a single external page is equal to more than two internal pages. FIG. 8 illustrates an example process for responding to a write command in which the external page size is greater than the combined size of two internal pages.

FIG. 8 illustrates an example flow diagram showing an illustrative process 800 for responding to a write command according to some implementations. In general, the process 800 may be implemented by a memory device configured with a page emulation mode in which the external page size is greater than two internal pages. At 802, the memory device receives a write command from an external source, such as a memory device controller. The write command is a command to edit a portion of data associated with a page of an external page size (e.g., the page size associated with the external source) stored in a cache.

At 804, the memory device determines if the write command is directed to a first set of data bits (e.g., the data associated with the first internal page) and if the write command is directed to the first set of data bits (e.g., the data associated with the first internal page), the process 800 proceeds to 806. At 806, the memory device calculates the parity bits for the first set of data bits.

If, however, the write is not directed to the first set of data bits, the process 800 advances to 808. At 808, the memory device determines if the write command is directed to another set of data bits (e.g., the data associated with another internal page) and if the write command is directed to another set of data bits, the process 800 proceeds to 810. At 810, the memory device sets flags associated with the other sets of data bits. The flag is an indication that the associated set of data is dirty and that before the memory device writes that set of data back to the memory array during the precharge phase, it may be appropriate for the memory device to calculate the parity bits for that set of data bits. For example, if a single external page is equal to four internal pages, the memory device may set flags indicating the second and fourth internal page are dirty when the data bits associated with both the second and fourth internal pages have been written. After 810, the process 800 proceeds to 812 and the memory device waits for the next command.

After setting the flag or calculating the parity bits for the first set of data bits, the process 800 advances to 812. At 812, the memory device waits for the next command from the external source. The next command may be a precharge command to write back the data of the cache to the memory array and prepare the cache for another page, a read command to read the data stored in the cache, and/or another write command.

Figure 9:
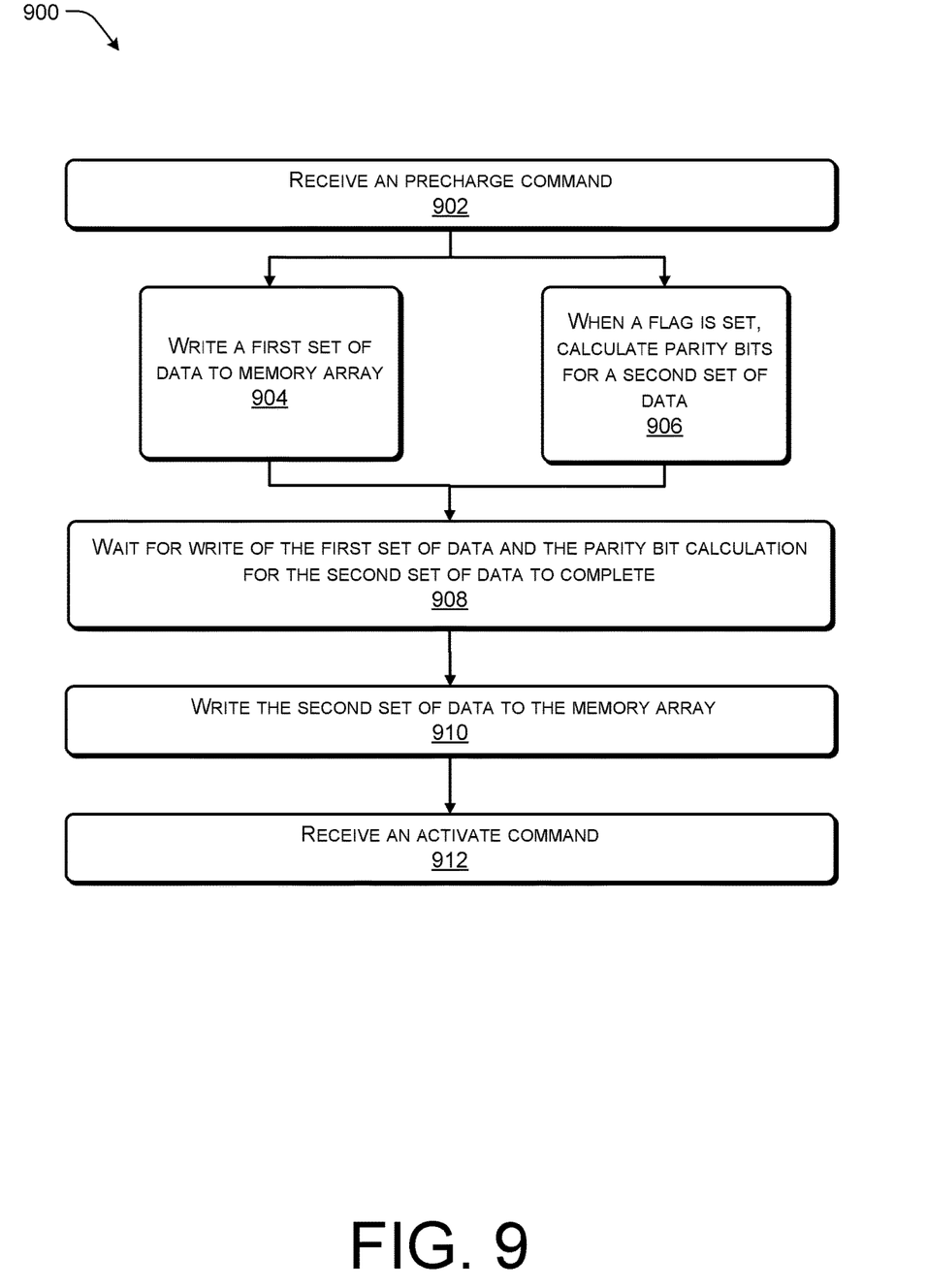
FIG. 9 illustrates an example flow diagram showing an illustrative process for responding to a precharge command implementing error correction according to some implementations.

FIG. 9 illustrates an example flow diagram showing an illustrative process 900 for responding to a precharge command implementing error correction according to some implementations. In general, the process 900 may be implemented by a memory device configured to include a page emulation mode in which the external page size is equal to twice the size of the internal page size, such that two pages of internal size are loaded into the cache before receiving a read or write command from the external source. At 902, the memory device receives a precharge command from an external source, such as a memory device controller. The precharge command is a command to write data associated with a page of external page size (e.g., the page size associated with the external source issuing the precharge command) from a cache back into a memory array.

In the illustrated example, after receiving the precharge command, the memory device performs both 904 and 906 in parallel. However, in other examples, the process 900 may perform 904 or 906 in a linear sequence with either 904 or 906 being preformed first. In some specific examples, the memory device may determine if a flag indicating the second set of data is dirty has been set before performing either 904 or 906.

At 904, the memory device writes the first set of data to the memory array. The first set of data is the data associated with the first internal page stored in the cache. The first set of data may be written back to the memory array at this time without calculating the associated parity bits, as the parity bits for the first internal page are counted as part of the write operations, as described above with respect to FIG. 7.

At 906, the memory device calculates the parity bits for the second set of data when the flag indicating the second set of data is dirty is set. The second set of data is the data associated with the second internal page stored in the cache. As described above with respect to FIG. 3, these two processes may be performed in parallel to reduce the total amount of time assigned to the precharge operations.

At 908, the memory device waits until the first set of data is written to the memory array and the parity bits for the second set of data are calculated. When both are complete, the process 900 advances to 910. At 910, the memory device writes the second set of data to the memory array, completing the operations associated with the precharge command. Once the precharge operations are complete with respect to both the internal pages (e.g., the first set of data and the second set of data are written into the memory array), the process 900 proceeds to 912. At 912, the memory device receives the next activate command from the external source.

The process 900 in FIG. 9 is described and illustrated with respect to an external page size equal to two internal pages. However, in some implementations, the external page size may equal more than two integral pages, for example, the external page may equal K internal pages. In this implementation, the memory device may continue to write data associated with a (K−1)th internal page and calculate the parity bits for the Kth internal page until parity bits are calculated for each of the K internal pages.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory, comprising:
   an array that includes rows and columns of memory cells;
   a cache, wherein the cache stores a first set of data bits associated with a first internal page and a second set of data bits associated with a second internal page, where the first and second sets of data bits correspond to a page of an external page size that is greater than a page size for each of the first and second internal pages; and
   circuitry, including write drivers, coupled to the array and the cache, wherein in response to a single command to write data bits from the cache to the array that is received by the memory from external to the memory, the circuitry is configured to:
      write the first set of data bits into the array using the write drivers; and
      after writing the first set of data bits back into the array, write the second set of data bits into the array using the write drivers.

2. The memory of claim 1, wherein the single command to write data bits from the cache to the array is a precharge command.

3. The memory of claim 1, wherein in response to a write command received by the memory from external to the memory the circuitry is configured to:
 determine that the write command is directed to the first set of data bits; and
 edit a portion of the data in the first set of data bits stored in the cache based on the write command.

4. The memory of claim 3, wherein the memory is configured to calculate parity bits for the first set of data bits prior to writing the first set of data bits from the cache into the array.

5. The memory of claim 4, wherein the memory is configured to calculate the parity bits for the first set of data bits prior to receiving the single command to write data from the cache to the array.

6. The memory of claim 1, wherein in response to the single command to write data bits from the cache to the array, the circuitry is further configured to write the first set of data bits back into the array while parity bits for the second set of data bits are calculated.

7. The memory of claim 1, wherein the circuitry is configured to write both the first set of data bits and the second set of data bits in a same physical row within the array.

8. The memory of claim 7, wherein the circuitry further comprises:
 word line circuitry coupled to the array, wherein the word line circuitry is configured to drive a word line voltage across the same physical row in the array while the first and second sets of data bits are written from the cache into the array.

9. The memory of claim 1, further comprising:
 a configurable bit that, when set, causes the memory to enter a page emulation mode, wherein the memory writes both the first and second sets of data bits from the cache to the array in response to the single command to write data bits from the cache to the array based on the configurable bit being set.

10. The memory of claim 9, wherein the configurable bit is included in a programmable register on the memory.

11. The memory of claim 9, wherein the configurable bit is included in a fuse programmable register.

12. The memory of claim 1, further comprising:
 a programmable register to indicate the external page size, wherein the size of the external page indicates a number of internal precharge operations performed by the memory in response to receiving the single command to write data bits from the cache to the array, wherein each internal precharge operation writes a set of data bits corresponding to an internal page from the cache to the array.

13. The memory of claim 1, wherein the circuitry includes sense amplifier circuitry used to sequentially load the first set of data bits and the second set of data bits from the array to the cache.

14. The memory of claim 13, wherein the memory is configured to sequentially load the first and second data bits into the cache in response to a single activate command and a single address received by the memory.

15. A method of operation of a memory, comprising:
 receiving, by the memory, a single command to write data bits from a cache in the memory to an array of memory cells in the memory;
 in response to the memory receiving the single command:
  writing a first set of data bits corresponding to a first internal page from the cache into the array; and
  after writing the first set of data bits, writing a second set of data bits corresponding to a second internal page from the cache into the memory array, wherein writing the first set of data bits and writing the second set of data bits uses a same set of write drivers in the memory.

16. The method of claim 15, wherein the single command is a precharge command.

17. The method of claim 15, wherein, prior to writing the first and second sets of data bits from the cache into the memory array, determining that the memory is in a page emulation mode based on a register on the memory.

18. The method of claim 15, wherein writing the first and second sets of data bits from the cache to the array further comprises holding a selected word line high while using a first physical column address to write the first set of data bits and subsequently using a second physical column address to write the second set of data bits.

19. A method of operation of a memory, comprising:
 receiving, by the memory, a write command directed at data in a first set of data stored in a cache within the memory, wherein the cache also stores a second set of data, wherein the first set of data corresponds to first internal page of the memory, and wherein the second set of data corresponds to second internal page of the memory;
 in response to the write command, editing the data in the first set of data stored in the cache;
 after editing the data, receiving, by the memory, a single command to write data from the cache to an array of memory cells in the memory; and
 in response to the memory receiving the single command to write data from the cache to the array of memory cells:
  determining that only the first set of data has been modified in the cache;
  writing the first set of data from the cache to the array of memory cells; and
  not writing the second set of data from the cache to the array of memory cells based on the determination that only the first set of data has been modified in the cache.

20. The method of claim 19 further comprises:
 after writing the first set of data from the cache into the array of memory cells, receiving, by the memory, an activate command;
 in response to the activate command:
  reading a third set of data corresponding to a third internal page from the array of memory cells within the memory;
  after reading the third set of data, storing the third set of data in the cache within the memory;
  after reading the third set of data, reading a fourth set of data corresponding to a fourth internal page from the array of memory cells, wherein reading the third set of data and reading the fourth set of data uses a same set of sense amplifiers in the memory; and
  after reading the fourth set of data, storing the fourth set of data in the cache within the memory;
 after receiving the activate command, receiving, by the memory, at least one additional write command directed at data in the third and fourth sets of data in the cache;
 in response to the at least one additional write command, editing the third and fourth sets of data in the cache;

after editing the third and fourth sets of data in the cache, receiving, by the memory, an additional single command to write data from the cache to the array of memory cells in the memory; and in response to the memory receiving the additional single command to write data from the cache to the array of memory cells in the memory, sequentially writing both the third set of data and the fourth set of data from the cache into the memory array.

* * * * *